US007181863B2

(12) United States Patent
Ferrell et al.

(10) Patent No.: US 7,181,863 B2
(45) Date of Patent: Feb. 27, 2007

(54) WAFER DRYER AND METHOD FOR DRYING A WAFER

(75) Inventors: Gary W. Ferrell, San Gregorio, CA (US); Jagjit S. Ratra, Campbell, CA (US)

(73) Assignee: SEZ America, Inc., Mountain View, CA (US)

(*) Notice: Subject to any disclaimer, the term of this patent is extended or adjusted under 35 U.S.C. 154(b) by 57 days.

(21) Appl. No.: 11/075,872

(22) Filed: Mar. 9, 2005
(Under 37 CFR 1.47)

(65) Prior Publication Data
US 2005/0257396 A1 Nov. 24, 2005

Related U.S. Application Data

(60) Provisional application No. 60/568,566, filed on May 6, 2004, provisional application No. 60/551,729, filed on Mar. 9, 2004.

(51) Int. Cl.
*F26B 3/00* (2006.01)

(52) U.S. Cl. ................................ 34/340; 34/78; 34/80

(58) Field of Classification Search .................. 34/340, 34/380, 381, 78, 80; 134/2, 3
See application file for complete search history.

(56) References Cited

U.S. PATENT DOCUMENTS

| | | | | |
|---|---|---|---|---|
| 5,772,784 | A | 6/1998 | Mohindra et al. | 134/21 |
| 5,964,958 | A | 10/1999 | Ferrell et al. | 134/26 |
| 5,968,285 | A | 10/1999 | Ferrell et al. | 134/26 |
| 5,985,041 | A * | 11/1999 | Florez | 134/2 |
| 6,119,367 | A | 9/2000 | Kamikawa et al. | 34/401 |
| 6,128,830 | A * | 10/2000 | Bettcher et al. | 34/404 |
| 6,200,387 | B1 | 3/2001 | Ni | 118/722 |
| 6,216,364 | B1 * | 4/2001 | Tanaka et al. | 34/448 |
| 6,219,936 | B1 | 4/2001 | Kedo et al. | 34/381 |
| 6,598,314 | B1 | 7/2003 | Kuo et al. | 34/265 |
| 2002/0176931 | A1 * | 11/2002 | Goseki et al. | 427/140 |

* cited by examiner

*Primary Examiner*—S. Gravini
(74) *Attorney, Agent, or Firm*—Schneck & Schneck; Thomas Schneck

(57) ABSTRACT

A wafer dryer and method featuring a nebulizer which emits a pressurized drying liquid stream that converges with an opposed pressurized non-reactive carrier gas stream to produce a drying liquid fog. The pressurized non-reactive gas spray device is disposed partially within a tub and partially within a wafer bath vessel housing a wafer to be dried. The tub has a vent port for allowing the drying liquid fog to pass into the wafer bath vessel to adhere to exposed wafer surfaces and displace remaining liquid on wafer surfaces, thus drying the wafer. The tub may further include a drain for draining drying liquid not converted into the fog or which has condensed. The vent also may include means for retaining larger drying liquid fog particles which allows smaller drying liquid fog particles to pass into the wafer bath vessel.

22 Claims, 4 Drawing Sheets

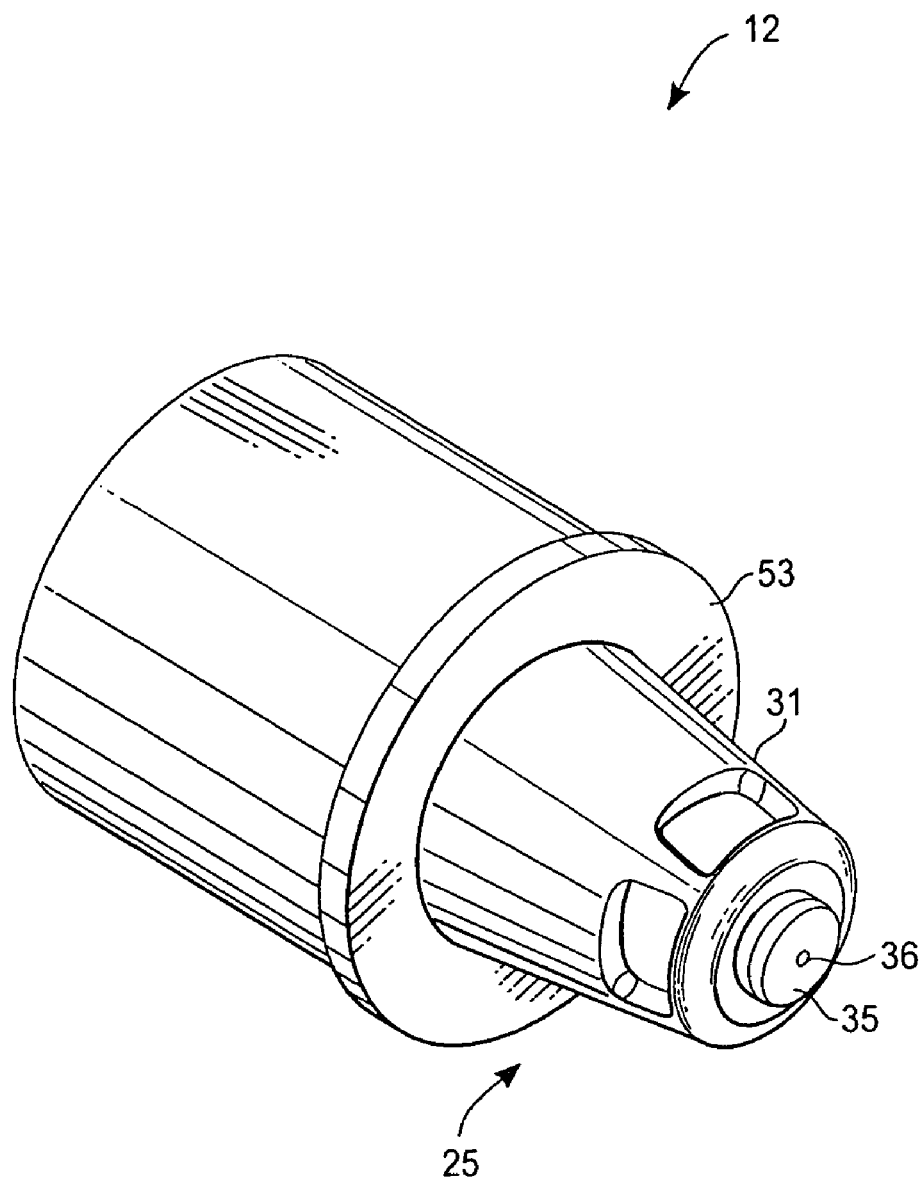
Fig._2

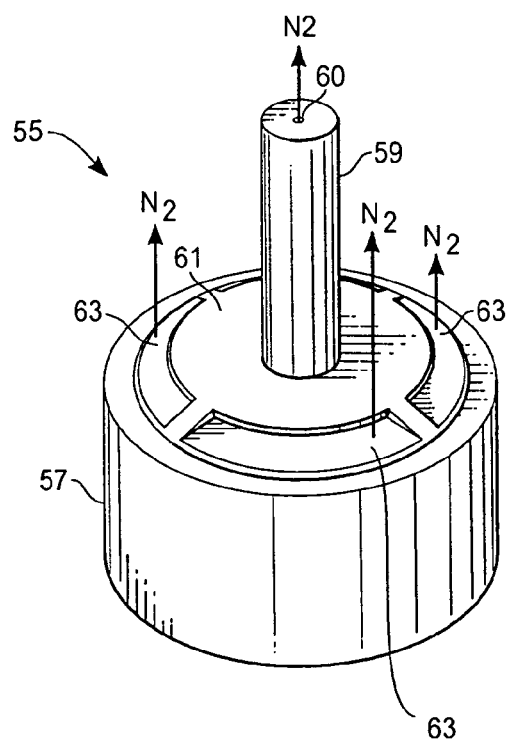
*Fig._4*
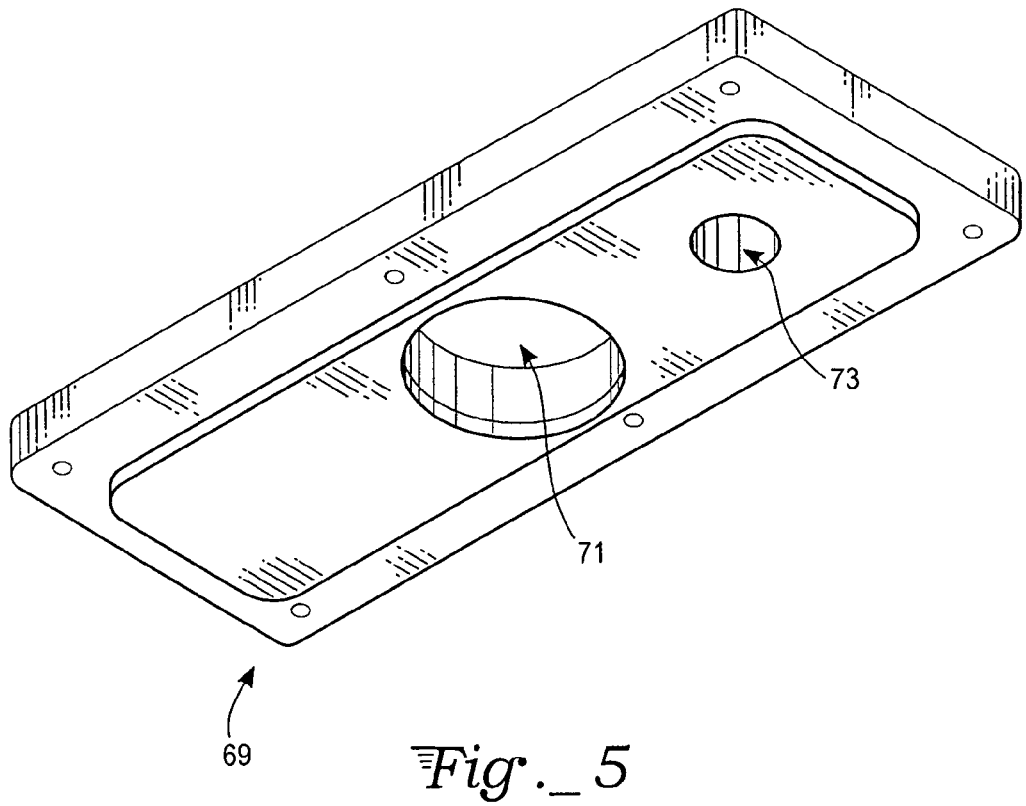
*Fig._5*

WAFER DRYER AND METHOD FOR DRYING A WAFER

CROSS REFERENCE TO RELATED APPLICATIONS

This application claims benefit of priority of U.S. provisional application Ser. No. 60/551,729 entitled "Wafer Dryer" filed on Mar. 9, 2004, and U.S. provisional application Ser. No. 60/568,566 entitled "Wafer Dryer" filed on May 6, 2004, which are hereby incorporated by reference.

FIELD OF INVENTION

The invention relates to an apparatus and method for drying, in general, and more particularly, to an apparatus and method for drying one or more semiconductor wafers.

BACKGROUND OF THE INVENTION

During the processing of semiconductor wafers, the wafers are typically immersed within a bath vessel having a sinking concentration of deionized water or other liquid with which to rinse the wafer. After immersion in the bath vessel liquid, the semiconductor wafer is dried. Various systems and methods are known for drying semiconductor wafers.

For example, U.S. Pat. No. 6,598,314 to Kuo et al. discloses a method and apparatus for drying a wafer involving creation of an isopropyl alcohol vapor using an ultrasonic nebulizer. The water and the isopropyl alcohol used by the cleaning and drying process are heated and evaporated using microwave energy.

In another example, U.S. Pat. No. 6,200,387 to Ni discloses utilizing pressurized nebulized isopropyl alcohol to form a thin film on a surface of the deionized rinse water to push most water and some residue particles away from a semiconductor wafer by its lower surface tension. Heated nitrogen is then used to purge and dry the wafer and a process chamber in which the wafer is disposed.

In yet another example, U.S. Pat. No. 6,219,936 to Kedo et al. discloses a wafer drying apparatus and method including immersing a wafer in pure water and a mist spraying device spraying nitrogen gas onto a liquid level of water in a drying chamber. Isopropyl alcohol is simultaneously sprayed with the nitrogen gas to form a mist form of isopropyl alcohol to replace the water on the wafer.

In one example, U.S. Pat. No. 6,110,367 to Kamikawa et al. discloses a vibration transmitting device for removing water adhering to the surfaces of cleaned semiconductor wafers.

There is a further need in the industry to provide a new apparatus and method for drying wafers.

Thus, it is an object of the present invention to provide a new apparatus and method for drying wafers.

It is another object of the present invention to provide a cost-effective and simple to use apparatus and method for drying wafers.

Yet another object of the present invention is to provide an efficient apparatus and method for drying wafers.

SUMMARY OF THE INVENTION

These and other objects have been achieved by a wafer dryer which supplies a drying liquid fog to a wafer bath vessel housing a wafer to be dried. The drying fog is created at a location where a spray of pressurized drying liquid from, for example, a nebulizer meets a spray of pressurized inert carrier gas. The invention may rely on techniques for the vaporization or atomization of liquid similar to techniques used in respiratory therapy. The wafer bath vessel supports at least one wafer in an upright position with exposed wafer surfaces to be dried. The nebulizer resides, at least partially, in a tub which is mounted to the bath vessel. The tub has one or more vents for allowing the drying liquid fog to pass into the wafer bath vessel, one or more barriers for limiting the size of the fog aerosol passing through the vent, and means for draining drying liquid which is not converted to a fog or that condenses into droplets before reaching the vent. The barrier creates an opening of a desired size which allows only drying liquid fog particles of a particular size to pass or includes a lip which blocks larger fog particles from passing.

A wafer vessel supports at least one wafer in a sinking bath of deionized water. A tub which is mounted to the wafer vessel contains the nebulizer, or other spray device, of a type having a nozzle with a drying liquid flow path. A central path is used to introduce a drying liquid from the flow path to an opposing inert carrier gas flow. The convergence of the drying liquid and the inert carrier gas beneath the nozzle produces the drying liquid fog. The fog of drying liquid that is created is swept toward a vent port by a stream of incoming inert gas entering the tub. Incoming inert gas may also emerge upwardly from a plurality of closely spaced holes in a flange surrounding a throat connected or adjacent to the nozzle.

The drying liquid fog adheres to the exposed wafer surface. Excess fog forms a thin layer on the sinking body of water. This layer is effective for driving water from the wafer surface as the water level sinks. The drying liquid, such as alcohol, is then evaporated from the wafer surface once the wafer is out of the water bath.

BRIEF DESCRIPTION OF THE DRAWINGS

FIG. 2 is a perspective view of a portion of a nebulizer of FIG. 1 including a nozzle.

FIG. 4 is a perspective view of a gas spraying device of FIG. 1.

FIG. 5 is a perspective view of a plate of FIG. 1.

DETAILED DESCRIPTION OF THE INVENTION

Figure 1:
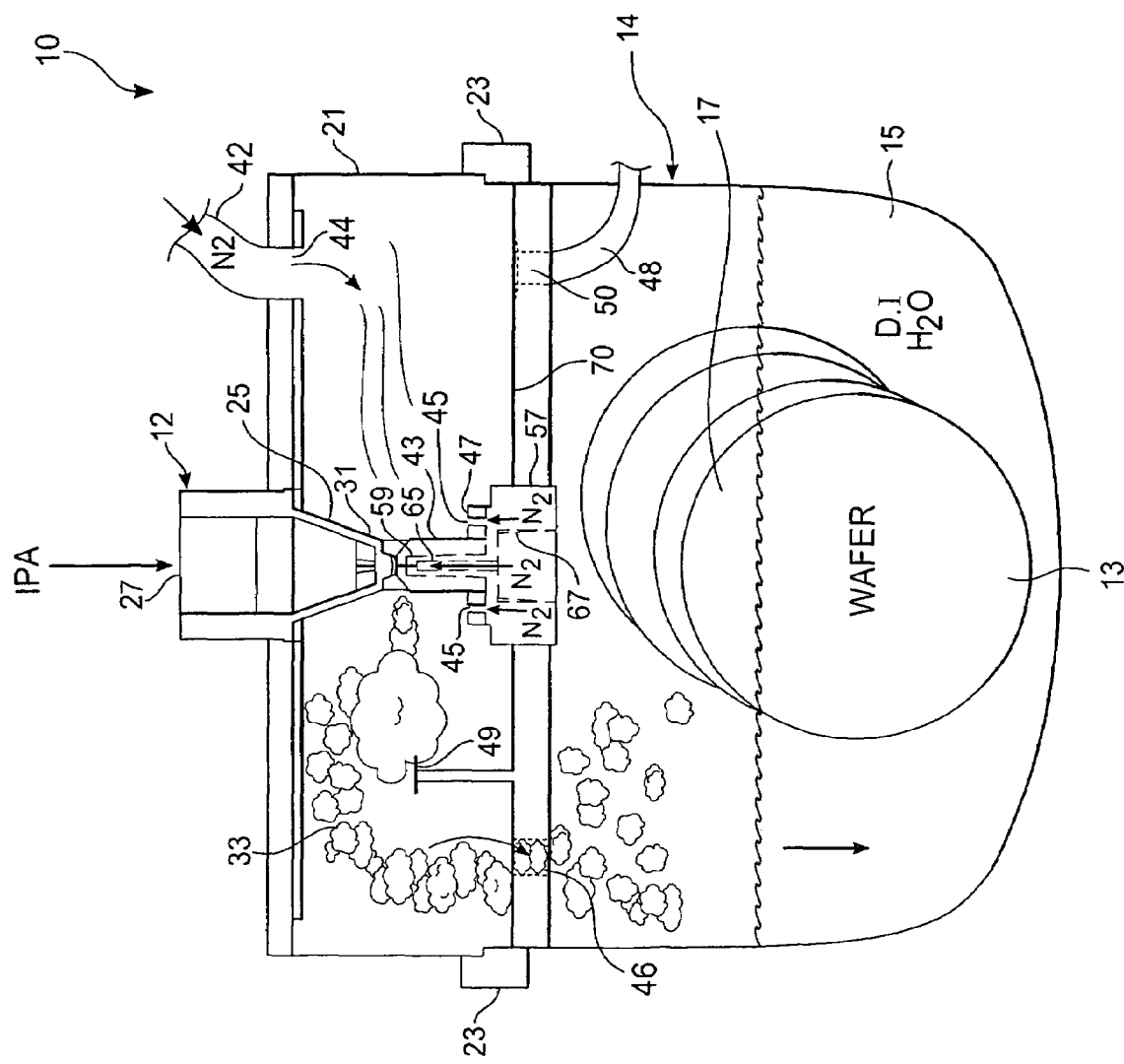
FIG. 1 is a cross-sectional view of the apparatus of the present invention in association with a vessel.

With reference to FIG. 1, there is seen is a wafer dryer system 10 featuring a nebulizer apparatus 12 or other spray apparatus which may be connected to a wafer bath vessel 14. In one example, the vessel is comprised of TEFLON. The wafer bath vessel 14 supports at least one wafer 17 in an upright position with exposed wafer surfaces to be dried. The nebulizer 12 resides, at least partially, in a tub 21 which is mounted to the bath vessel 14. The spray device, in one example, a nebulizer, emits a stream of pressurized drying liquid which meets an opposing stream of pressurized inert carrier gas from a pressurized inert carrier (non-reactive) gas spraying device 55 having a body 57 and an inert carrier channel 59. The convergence of the central drying liquid stream and the inert carrier gas stream produces a drying liquid fog 33. The streams of drying liquid and inert carrier gas are from pressurized sources. For example, the drying liquid has a pressure ranging from 5–50 psi. For example, the inert carrier gas has a pressure ranging from 5–100 psi. In one example, the fog comprises drying fluid particulates having a diameter in the range of 10 to 50 microns.

Still referring to FIG. 1, the wafer vessel 14 is supporting wafer 17 in a sinking bath 15 of liquid, for example, deionized water (D.I. H$_2$O). Typically, the water drops at a rate of about 1 mm per second leaving a partially exposed wafer surface 17. Tub 21 is mounted to vessel 14 by means of, for example, brackets 23. The tub includes a lower surface and may acts as a lid for the bath vessel 14. The tub contains nebulizer 12 of the type having a drying liquid flow path. A central path 27 is used to emit a pressurized drying liquid such as isopropyl alcohol (IPA) through opening 36 (FIG. 2). A pressurized inert carrier gas, such as dry nitrogen under pressure (N$_2$), is emitted and opposes and is convergent with the liquid beneath nozzle tip 35 of lower part of nozzle 31. The dry nitrogen, or other inert carrier gas, is supplied by a inert carrier gas source (not shown) connected to an inert carrier gas line (not shown) disposed within inert carrier gas body 67 (FIG. 1) and chamber 65 within the spraying device 55.

Figure 3A:
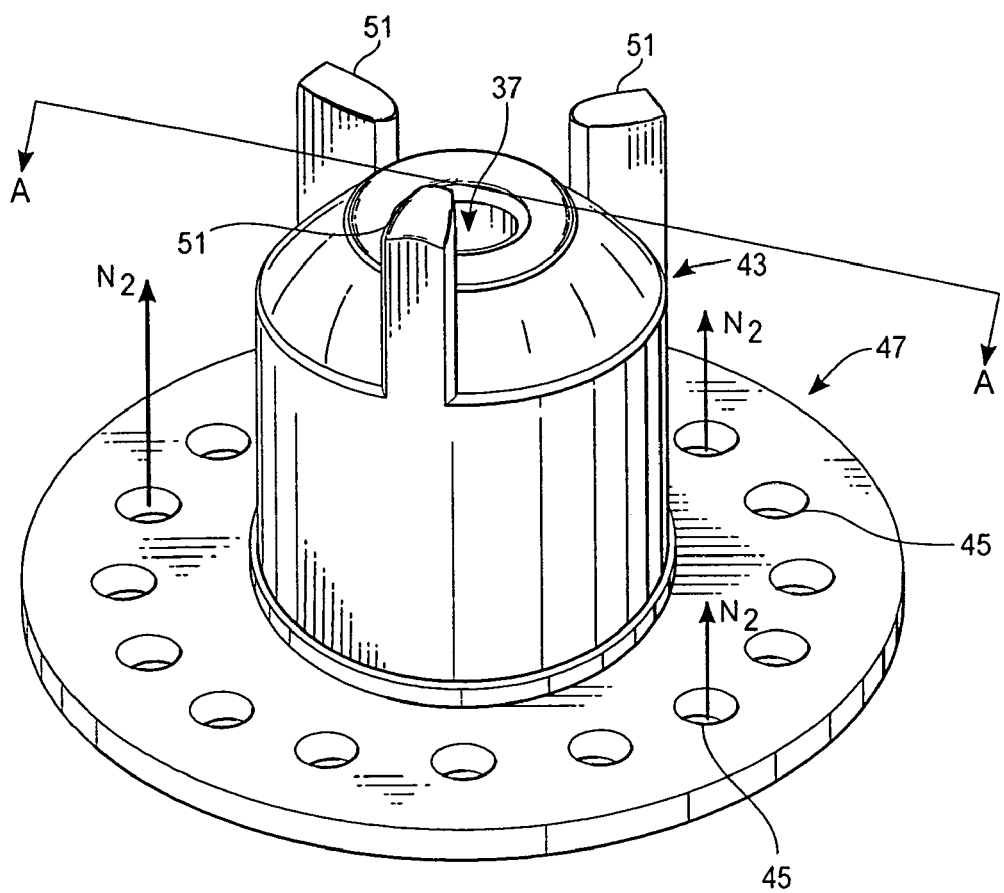
FIG. 3a is a perspective view of a flange and a throat of FIG. 1.

Between the nozzle tip opening 36 (FIG. 2) and opening 60 (FIG. 4) of device 55 in which chamber 59 is found, a drying liquid fog 33 is created and is swept toward vent port 46. A stream of incoming inert gas (for example N$_2$) from line 42 (FIG. 1) entering the tub through port 44 converges with drying liquid fog 33 and sweeps it toward the vent port 46. Incoming inert gas also emerges from openings 63 (FIG. 4) of main body 57 and through a plurality of closely spaced holes 45 (FIG. 3a) in a flange 47 surrounding throat 43 into tub 21 to create a gradient of nitrogen flow sweeping the drying fog 33 toward vent 46. Throat 43 is, in one example, disposed entirely within tub 21. The stream or streams of inert gas establish flow paths to the vent.

The tub 21 has means for retaining condensed drying liquid fog droplets. For example, tub 21 has an internal lip or barrier 49 that serves as a means for retaining drying liquid fog droplets or aerosol that are larger than desired for drying the water. The barrier forms an opening in the tub of a desired size which allows only drying liquid fog particles of a particular size to pass. Also, the lip blocks larger fog particles from passing.

Further, the tub 21 has a drain 50 which collects drying fluid that is not converted into the liquid fog 33 or that condenses into droplets before reaching the vent. The droplets are collected at drain 50 by gravity flow and are removed through tube 48.

Figure 3B:
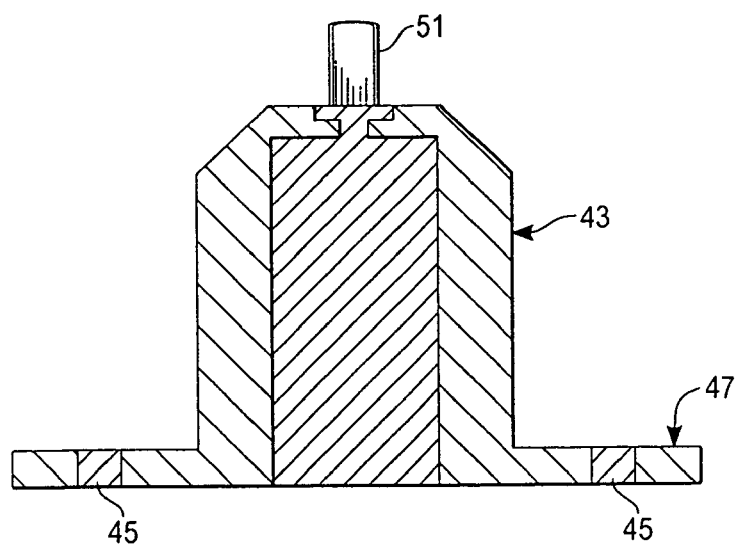
FIG. 3b is a cross-sectional view of FIG. 3a taken along the lines A—A.

With reference to FIG. 2, the nebulizer apparatus 12 is seen in more detail. Nozzle projection 35 of the nebulizer, or other drying liquid spray device, is, for example, inserted within throat opening 37 (seen in FIG. 3a) or is disposed above it. Inert carrier gas spray device 55 is disposed in the throat opening 50 so that its stream of inert carrier gas meets the liquid drying stream above the throat opening if the nozzle projection is disposed adjacent the throat opening and so that its stream of inert carrier gas meets the liquid drying stream in the throat opening if the nozzle projection is disposed in the throat opening in which case the projection would typically only partially block the opening so as to allow the formed liquid drying fog to exit. The throat 43 includes arms 51 (FIGS. 3a and 3b) which abut against a surface 53 of the nebulizer 12. The throat 43 is associated with flange 47 including holes 45 through which the inert carrier gas passes. The flange may be connected to or attached to the throat.

With reference to FIG. 1, in one example, the inert carrier gas spray device body 57 is disposed partially within tub 21, partially within an opening of lower surface 70 of tub 21, and partially within the vessel 14. The channel 59 is inserted within the throat 43 (FIGS. 3a and 3b) and the throat 43 rests upon an upper surface 61 of the main body 57. The inert carrier gas is emitted through openings 63 and flange openings 45. The liquid drying fog travels from the location of convergence of the drying liquid and gas out of the tub 21 through one or more vents 46 to the vessel 14.

With reference to FIG. 5, there is seen a plate 69 including an opening 71 through which the nebulizer 12 is inserted and an opening 73 through which line 42 is inserted. The plate is disposed on the tub 21.

The drying liquid fog 33 adheres to the exposed wafer surface 17. Excess fog forms a thin layer on the sinking body of water. This layer is effective for driving water from the wafer surface as the water level sinks. The drying liquid, such as alcohol, is then evaporated from the wafer surface once the wafer is out of the water bath.

What is claimed is:

1. A wafer dryer comprising:
   a wafer bath vessel having means for supporting at least one wafer having an exposed surface to be dried;
   and a tub mounted to the bath vessel, the tub having a drying liquid spray device and a non-reactive carrier gas spray device opposing the drying liquid spray device, the spray device emitting a stream of pressurized drying liquid that converges with a stream of opposed pressurized non-reactive carrier gas emitted by the spray device of pressurized non-reactive gas to produce a drying liquid fog, the tub also having means for venting the drying liquid fog into the wafer bath vessel, the drying liquid fog drying the wafer.

2. The apparatus of claim 1 further comprising means for retaining relatively larqer sized drying liquid fog particles and wherein said means for venting include means for venting the non-retained drying liquid fog particles into the water bath vessel.

3. The apparatus of claim 1 wherein said means for retaining larger sized drying liquid fog particles includes a lip.

4. The apparatus of claim 1 wherein said means for venting the drying liquid fog into the wafer bath vessel includes a port disposed in said tub.

5. The apparatus of claim 1 wherein said drying liquid is isopropyl alcohol and said non-reactive carrier gas is nitrogen.

6. The apparatus of claim 1 wherein the tub includes a decreasing volume of water.

7. The apparatus of claim 1 wherein said tub further has a source of non-reactive carrier gas introducing a non-reactive carrier into said tub.

8. The apparatus of claim 1 wherein said drying liquid spray device includes a tip with a tip opening through which the pressurized drying liquid stream is emitted in a first direction and wherein the pressurized non-reactive carrier gas source includes an opening through which the pressurized drying liquid stream is emitted in a second direction opposing the first direction.

9. The apparatus of claim 8 further comprising a throat adjacent to the spray device tip, the non-reactive carrier gas source disposed at least partially in the throat and partially in the wafer bath vessel, the throat comprising an opening, wherein the pressurized non-reactive carrier gas is emitted through the throat.

10. The apparatus of claim 9 wherein said spray device tip is disposed within the throat opening, partially blocking the opening1 and wherein said drying liquid stream and said non-reactive gas stream converge in the throat.

11. The apparatus of claim 9 wherein said spray device tip is disposed adjacent the throat opening and said non-reactive gas stream is emitted through the throat opening to converge with maid drying liquid stream beneath said spray device tip and above said throat opening.

12. The apparatus of claim 9 wherein said pressurized non-reactive gas stream source emits a central stream of non reactive gas and one or more streams of non-reactive gas through openings in a body of said source co-axial with said central stream.

13. The apparatus of claim 12 further comprising a flange disposed about a lower portion of said throat, said flange including openings receiving maid one or more co-axial streams of non-reactive gas.

14. The apparatus of claim 1 wherein maid drying liquid spray device is a nebulizer.

15. A method for drying a wafer comprising:
emitting a stream of pressurized drying liquid;
emitting a stream of pressurized non-reactive carrier gas opposed to said drying liquid stream, maid streams converging to produce a drying liquid fog;
venting the drying liquid fog into a wafer bath vessel haying at least one wafer with an exposed surface to be dried; and
drying the exposed surface to be dried with said drying liquid fog.

16. The method of claim 15 further comprising providing a non-reactive carrier gas stream for moving said drying liquid fog toward said exposed surface.

17. The method of claim 15 wherein said drying liquid is isopropyl alcohol and said non-reactive carrier gas is nitrogen.

18. The method of claim 15 further comprising retaining relatively larger particles of the liquid drying fog and venting relatively smaller particles of the liquid drying fog.

19. The wafer dryer of claim 1 wherein one of the drying liquid spray device and the non-reactive carrier gas spray device is disposed above the other.

20. The wafer dryer of claim 1 wherein the drying liquid spray device only emits drying liquid and the non-reactive carrier gas spray device emits only non-reactive carrier gas.

21. The wafer dryer of claim 1 wherein the drying liquid spray devices emits drying liquid and not non-reactive carrier gas and the non-reactive carrier gas spray device emits non-reactive carrier gas and not drying liquid spray.

22. The method of claim 15 wherein said stream of drying liquid consists of drying liquid and wherein said stream of pressurized drying liquid consists of pressurized drying liquid.

\* \* \* \* \*

UNITED STATES PATENT AND TRADEMARK OFFICE
CERTIFICATE OF CORRECTION

PATENT NO.       : 7,181,863 B2
APPLICATION NO.  : 11/075872
DATED            : February 27, 2007
INVENTOR(S)      : Gary W. Ferrell and Jagjit S. Ratra Page 1 of 1

It is certified that error appears in the above-identified patent and that said Letters Patent is hereby corrected as shown below:

Column 5, claim 10, lines 2-3 should read:
"...blocking the opening, and wherein said drying liquid stream..."

Column 5, claim 13, line 17 should read:
"...openings receiving said one or more co-axial"

Column 5, claim 15, line 24 should read:
"...opposed to said drying liquid stream, said streams"

Column 5, claim 15, lines 26-27 should read:
"vessel having at least one wafer..."

Signed and Sealed this

Ninth Day of December, 2008

JON W. DUDAS
*Director of the United States Patent and Trademark Office*